United States Patent
John

(10) Patent No.: US 7,702,964 B2
(45) Date of Patent: Apr. 20, 2010

(54) COMPRESSION OF DATA TRACES FOR AN INTEGRATED CIRCUIT WITH MULTIPLE MEMORIES

(75) Inventor: Johnny K. John, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 777 days.

(21) Appl. No.: 10/843,971

(22) Filed: May 11, 2004

(65) Prior Publication Data

US 2005/0268177 A1 Dec. 1, 2005

(51) Int. Cl.
*G06F 11/00* (2006.01)

(52) U.S. Cl. .......................... 714/45; 714/47; 717/124; 717/128

(58) Field of Classification Search ............... 714/45
See application file for complete search history.

(56) References Cited

U.S. PATENT DOCUMENTS

| | | | | |
|---|---|---|---|---|
| 6,345,295 | B1 * | 2/2002 | Beardsley et al. | 709/224 |
| 6,594,782 | B1 * | 7/2003 | Tagawa | 714/30 |
| 6,775,798 | B2 | 8/2004 | Watkins | |
| 6,918,065 | B1 * | 7/2005 | Edwards et al. | 714/45 |
| 7,017,093 | B2 | 3/2006 | Broberg, III | |
| 7,069,176 | B2 * | 6/2006 | Swaine et al. | 702/176 |
| 7,149,933 | B2 * | 12/2006 | Swaine et al. | 714/45 |
| 7,325,168 | B2 * | 1/2008 | Bradley et al. | 714/45 |
| 2002/0059511 | A1 * | 5/2002 | Sudo et al. | 712/207 |
| 2003/0191624 | A1 * | 10/2003 | Morigaki et al. | 703/28 |
| 2004/0199902 | A1 * | 10/2004 | Dodson et al. | 717/128 |

FOREIGN PATENT DOCUMENTS

| | | |
|---|---|---|
| EP | 0840218 | 10/1997 |
| EP | 1089085 | 9/2000 |
| EP | 1139220 | 3/2001 |

OTHER PUBLICATIONS

European Search Opinion-EP08165088, Search Authority-Munich Patent Office-Nov. 18, 2008.
European Search Report-EP08165088, Search Authority-Munich Patent Office-Nov. 18, 2008.
International Preliminary Report on Patentability-PCT/US05/016563, IPEA/US-May 29, 2007.
International Search Report-PCT/US05/016563, International Search Authority-European Patent Office-Aug. 11, 2005.
Written Opinion-PCT/US05/016563, International Search Authority-European Patent Office-Aug. 11, 2005.

* cited by examiner

*Primary Examiner*—Emerson C Puente
(74) *Attorney, Agent, or Firm*—Peter M. Kamarchik; Nicholas J. Pauley; Sam Talpalatsky

(57) ABSTRACT

Techniques for performing data tracing in an integrated circuit with multiple embedded memories are described. A trace module within the integrated circuit forms packets of trace data for memory accesses of the multiple memories. The trace module includes multiple data capture units (one for each memory) and a trace stream generator. Each data capture unit includes a register, a comparator, an address compressor, a data compressor, and a packetizer. The register stores an address for a prior memory access of the associated memory. The comparator compares an address for a current memory access against the address stored in the register. The address and data compressors perform address and data compression, respectively, for the current memory access. The packetizer forms a packet of trace data for the current memory access. The trace stream generator generates a stream containing trace data packets from all data capture units.

28 Claims, 6 Drawing Sheets

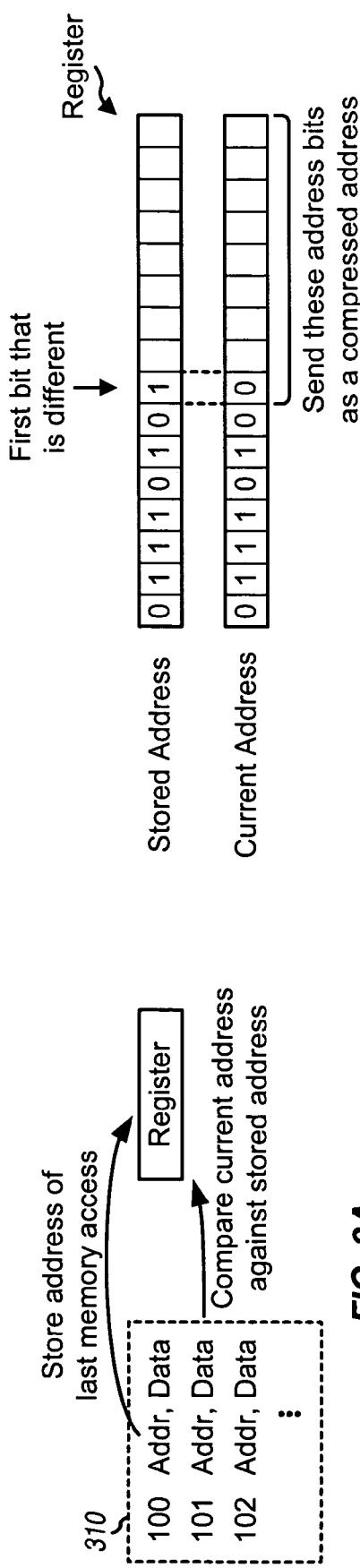
FIG. 3A
FIG. 3B
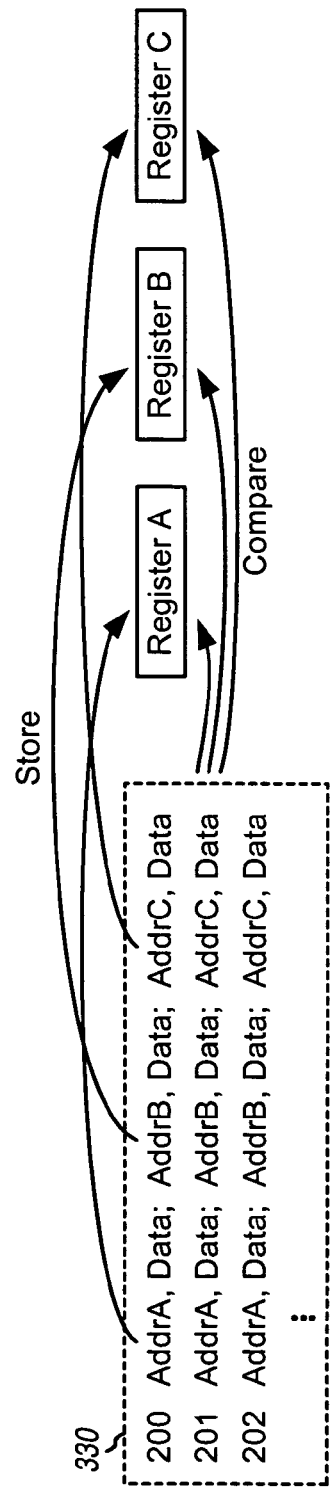
FIG. 3C

COMPRESSION OF DATA TRACES FOR AN INTEGRATED CIRCUIT WITH MULTIPLE MEMORIES

BACKGROUND

I. Field

The present invention relates generally to integrated circuits, and more specifically to techniques for compressing data and address traces for testing and debugging an integrated circuit with multiple memories.

II. Background

Continual improvement in integrated circuit (IC) fabrication technology has enabled more and more complicated integrated circuits to be fabricated for a variety of applications. For example, a system-on-chip (SOC) device may include a microprocessor, a memory, and other processing units, all of which are embedded on a single integrated circuit. The microprocessor may perform various functions and/or control the processing units. The processing units may be designed to perform specific computational tasks. The memory may store code and data for the microprocessor and processing units. The integration of all these circuit blocks on a single integrated circuit reduces cost and improves reliability.

An important aspect in the development of a complicated integrated circuit is the testing and debugging of the various circuit blocks within the integrated circuit. A technique commonly used for debugging an integrated circuit is real-time tracing, which includes program/instruction tracing and data tracing. Program tracing refers to the capture of lines of code being executed by processors within the integrated circuit, and data tracing refers to the capture of data accessed by the processors. The real-time tracing provides a user/developer with the capability to capture and view instructions and data accesses within the integrated circuit at run-time speed. This helps the user/developer to track down bugs in the hardware and/or code such as, for example, obscure bugs that only occur in situations where there is an unpredictable interaction between the hardware and code.

Real-time trace capability is normally provided by a trace module and a trace port that are embedded within the integrated circuit. The trace module typically includes configurable filters and trigger logic that allow the user/developer to select which instructions and data to capture and report. The captured information is often compressed and then provided via the trace port to an analysis tool located off-chip. Conventionally, the trace module only supports data tracing for a single memory or a unified data memory within the integrated circuit.

SUMMARY

Techniques for performing data tracing in an integrated circuit with multiple embedded memories are described herein. These techniques perform data tracing for each memory separately so that a higher degree of compression can be achieved for trace data captured by the tracing. In general, trace data may include memory address and data, program counter value, time reference, and any other information that may be useful for testing and debugging the integrated circuit. The trace data for each memory is appropriately identified based on a memory identifier assigned to that memory.

An embodiment provides an integrated circuit with multiple memories and a trace module. Each memory is accessible independently of the other memories, and the multiple memories may be accessed concurrently. The trace module forms packets of trace data for memory accesses of the multiple memories, one trace data packet for each memory access. Each trace data packet includes an address and/or data for a memory access of a particular memory and a memory identifier for that memory.

In an embodiment, the trace module includes multiple data capture units, a trace stream generator, and a buffer. One data capture unit is provided for each memory. Each data capture unit includes an address register, an address comparator, an address compressor, a data compressor, and a packetizer. The address register stores an address for a prior memory access of the associated memory. The address comparator compares an address for a current memory access of the associated memory against the address stored in the register. The address compressor performs address compression for the current memory access, based on the output from the address comparator, and generates a compressed address for the current memory access. The data compressor performs data compression for the current memory access. The packetizer forms a trace data packet for the current memory access of the associated memory. The trace stream generator receives trace data packets from the multiple data capture units and generates a trace data stream containing these packets. The buffer stores the trace data stream and provides the trace data off-chip when triggered.

Each trace data packet may include (1) a field for the memory identifier, (2) an address field having a variable size, (3) at least one field indicative of the address field size, (4) a data field having a variable size, (5) a field indicative of the data field size, and (6) possibly other fields. Various packet formats are described below. Each trace data packet may include (1) an uncompressed, compressed, or null address, (2) uncompressed, compressed, or null data, and (3) other information such as the memory identifier.

The integrated circuit may further include one or more digital signal processors (DSPs), microprocessors, controllers, and so on. The multiple memories may be used to store data for the DSP(s).

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein:

FIG. 3A shows data accesses for a conventional integrated circuit with a single memory;

FIG. 3B illustrates an address compression technique for data tracing;

FIG. 3C shows data accesses for an integrated circuit with multiple memories;

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
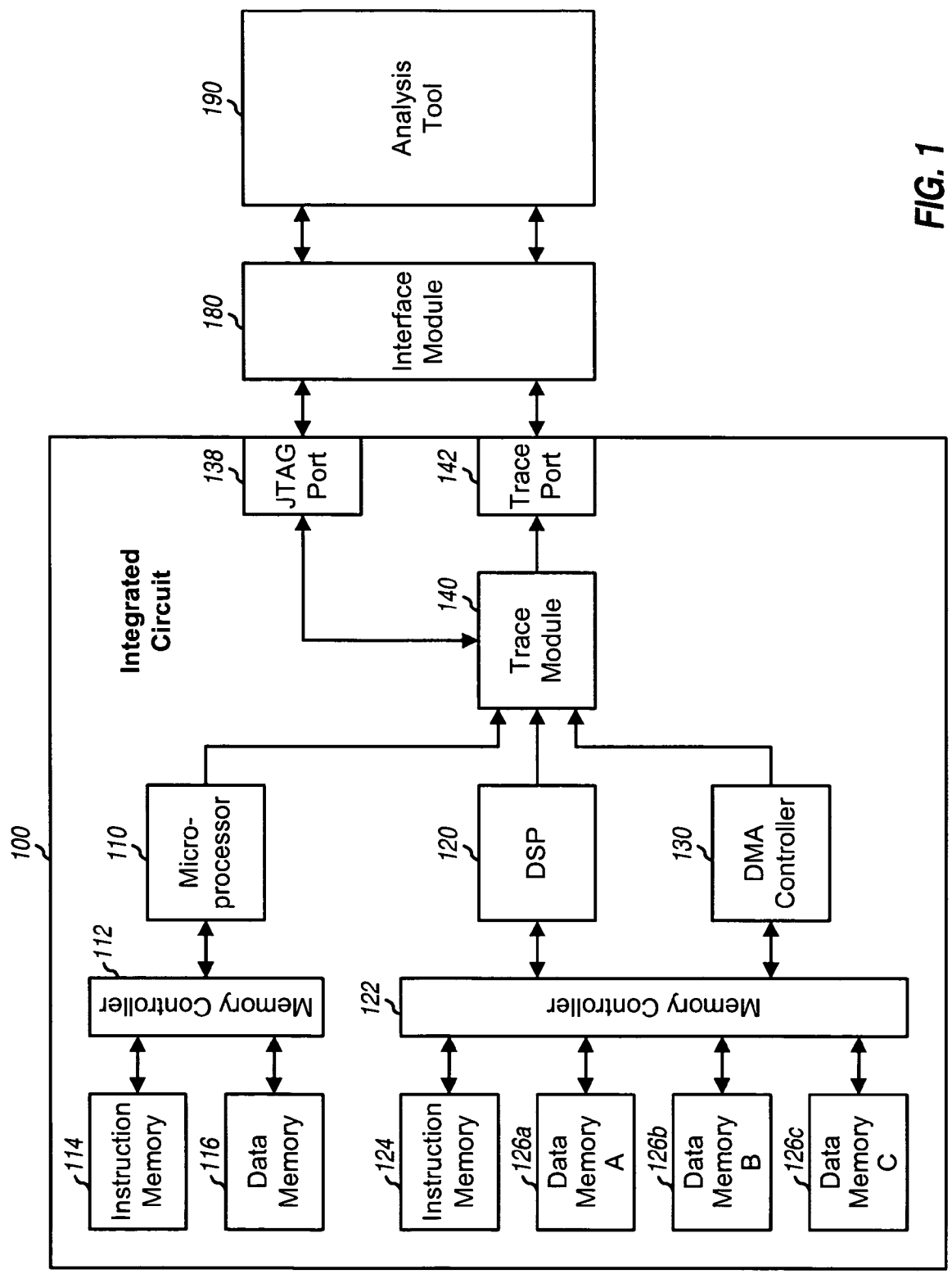
FIG. 1 shows an integrated circuit with multiple embedded memories and having tracing capability for testing and debugging.

FIG. 1 shows a block diagram of an integrated circuit 100 with multiple embedded memories and having tracing capability for testing and debugging. Integrated circuit 100 includes multiple embedded processors and controllers such as a microprocessor 110, a digital signal processor (DSP) 120, and a direct memory access (DMA) controller 130. Microprocessor 110 performs general processing for integrated circuit 100 and may be implemented with a reduced instruction set computer (RISC) or some other type of microprocessor. DSP 120 is a specialized processor that is specifically designed to perform mathematical computations very rapidly. DSP 120 may include various processing units such as multiply-accumulate units (MACCs), arithmetic logic units (ALUs), and so on. DMA controller 130 handles real-time high-rate data exchanges between DSP 120 and other processing units external to integrated circuit 100. For simplicity, the interconnections between microprocessor 110, DSP 120, and DMA controller 130 are not shown in FIG. 1. In general, integrated circuit 100 may include any number and any type of processors and controllers.

Microprocessor 110 implements a "Harvard" architecture, which uses separate instruction memory 114 and data memory 116 to store instructions and data, respectively. A memory controller 112 provides microprocessor 110 with the necessary instructions and data from memories 114 and 116. DSP 120 implements a "super-Harvard" architecture, which uses separate instruction memory 124 to store instructions and multiple data memories 126a through 126c to store data. Memories 126a, 126b, and 126c are also denoted as data memories A, B, and C, respectively. A memory controller 122 provides DSP 120 with the necessary instructions and data from memories 124 and 126. DMA controller 130 also interfaces with memory controller 122 for data exchanges. In general, the processors and controllers within integrated circuit 100 may implement any type of memory architecture. Moreover, integrated circuit 100 may include any number of memories.

Each memory within integrated circuit 100 is an independent memory that may be individually accessed to store/retrieve instructions/data. Each memory is managed by an associated memory controller. Each memory may also be referred to as a memory bank, a memory cache, or some other terminology. Conventionally, an integrated circuit includes a single memory or a unified memory for storing data. The single data memory can typically be accessed to obtain a particular number of (e.g., four) bytes of data at a time. Multiple data memories may be used to obtain various benefits such as, for example, parallel operation, higher memory throughput, and greater storage flexibility. For example, different kinds of data may be stored in different memories, and a DSP can exploit the separate memories to achieve parallel loads of the different kinds of data. Multiple data memories differ from a unified memory in that these multiple data memories may use separate address generation units, separate memory buses, instructions which can perform concurrent data accesses of the separate memories, independent data widths, and so on.

Integrated circuit 100 further includes a trace module 140, a trace port 142, and a JTAG (Joint Test Action Group) port 138, which collectively provide testing and debugging capabilities for the integrated circuit. Trace module 140 includes various circuit blocks and registers that are used to monitor internal buses of microprocessor 110, DSP 120, and DMA controller 130, as described below. Trace module 140 can capture information regarding the state of processors 110 and 120 and controller 130 to facilitate testing and debugging of integrated circuit 100. Trace module 140 can further capture the information in a "non-intrusive" manner, i.e., without adding any burden to the performance of the processors and controller so that these units can operate at full speed. Trace module 140 provides the captured information as a trace data stream via trace port 142. JTAG port 138 is used to configure trace module 140 and possibly the processors and controller within the integrated circuit. For simplicity, the interconnections between JTAG port 138 and the processors and controller are not shown in FIG. 1.

An analysis tool 190 interfaces with integrated circuit 100 via an interface module 180. Analysis tool 190 may be a computer system, a logic analyzer, and so on, and may be implemented with hardware, software, or a combination thereof. A user/developer who is testing or debugging integrated circuit 100 can configure trace module 140 via analysis tool 190, interface module 180, and JTAG port 138. The user/developer can, via trace port 142 and interface module 180, receive the trace data stream containing information captured by trace module 140. The user/developer can view and analyze the captured information using analysis tool 190.

Figure 2:
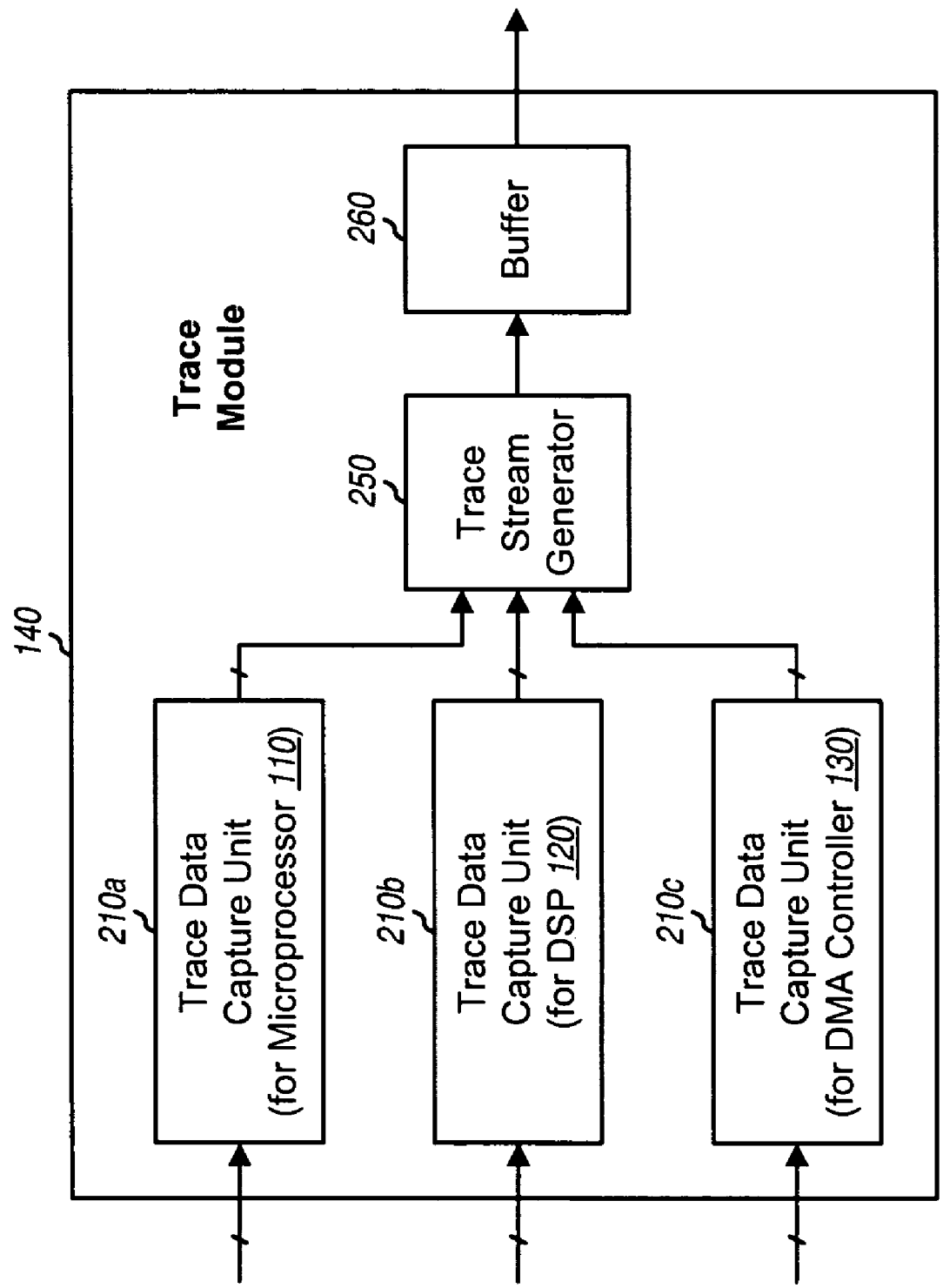
FIG. 2 shows a block diagram of a trace module.

FIG. 2 shows a block diagram of an embodiment of trace module 140. Trace module 140 includes three trace data capture units 210a, 210b, and 210c for microprocessor 110, DSP 120, and DMA controller 130, respectively, a trace stream generator 250, and a buffer 260. Each trace data capture unit 210 captures trace data for a respective processor or controller and provides packets of trace data, as described below.

Trace stream generator 250 receives trace data packets from all trace data capture units 210 and generates a trace data stream containing these packets. This single trace data stream thus carries trace data for instructions and memory accesses of all memories within integrated circuit 100. Buffer 260 stores the trace data from trace stream generator 250 and provides the stored trace data when triggered. Buffer 260 may be filled with trace data based on the following triggering mechanisms:

Trace after match—buffer 260 starts filling up with trace data once a trigger packet is received;

Trace before match—buffer 260 fills up continuously with trace data until a trigger packet is received; and Trace in center—buffer 260 fills up continuously with trace data until a trigger packet is received and then fills up with a specified number of trace data entries after receiving the trigger packet.

In general, the design of the trace module may be dependent on various factors such as, for example, the number and type of processors and controllers embedded within the integrated circuit, the memories associated with these processors and controllers, the desired debug capabilities, and so on.

FIG. 3A shows an exemplary sequence of data accesses 310 for a conventional integrated circuit with a single memory. Each data access is associated with a memory address and corresponding data at that address. For data tracing, the trace module receives both the address and data for each memory access, captures the pertinent information, and generates a trace data packet for the memory access. The trace module typically performs compression on the address and/or data in order to reduce the amount of information to include in the trace data packet.

FIG. 3B illustrates an address compression technique often used for data tracing. This address compression technique is based on an assumption that consecutive memory accesses are often made to memory locations close together. In this case, the address for each memory access may differ from the address for a prior memory access in only a small number of lower order or lesser significant bits. An address register is used to store the address for the last memory access. The address for the current memory access is compared against the stored address for the last memory access, and only the lower order bits in the current address that are different from the stored address (instead of the entire current address) are included in the trace data packet.

For ease of implementation, the trace data packet may be designed to carry a certain number of address bits (e.g., 5, 12, or 18 address bits, for an exemplary trace data packet design described below). In this case, the smallest possible number of address bits is included in the trace data packet based on the number of lower order bits that are different. For example, if three lower order address bits are different, then the trace data packet would include five lower order address bits for the exemplary design noted above. In effect, the compressed address is quantized to 5, 12, or 18 bits depending on the number of lower order bits that are different. The use of a single register to store the address of the last memory access provides adequate address compression performance for an integrated circuit with a single memory.

FIG. 3C shows an exemplary sequence of data accesses 330 for an integrated circuit with multiple memories (e.g., for integrated circuit 100 with three data memories 126a, 126b, and 126c). Multiple memories may be accessed concurrently, for example, to retrieve or store data for a single DSP instruction, which may include multiple arithmetic and/or logic operations. The data access for each memory is associated with a memory address and corresponding data at that address. Since the multiple memories may be accessed independently, the addresses for these memories may not be close to each other or correlated in any way. In this case, using a single address register to store a single memory address for address compression of multiple memories would provide poor compression performance if the addresses for these memories differ widely. As an example, the current addresses for memories A, B, and C may be 100, 5000, and 10000, respectively. If one address register is available, then this register would initially store memory A address of 100, which is then used for compression of memory B address of 5000, which is then used for compression of memory C address of 10000, which is then used for compression of memory A address for the next memory access, and so on. As can be seen, address compression performance may be poor using a single address register for multiple memories.

Multiple address registers may be used to obtain improved address compression performance for an integrated circuit with multiple memories. One address register is used for each memory, and each register stores the address of the last memory access for its associated memory. The address for the current memory access of each memory is compared against the address stored in the register for that memory. For the above example, registers A, B, and C would store addresses of 100, 5000, and 10000, respectively, for the current memory accesses of memories A, B, and C, respectively. For the next memory access, the address for memory A would be compared against the address stored in register A, the address for memory B would be compared against the address stored in register B, and the address for memory C would be compared against the address stored in register C. If consecutive memory accesses for each of these multiple memories are made to memory locations close together, which is the basic assumption used for the single-memory integrated circuit, then good address compression performance can be achieved for the integrated circuit with multiple memories.

Figure 4:
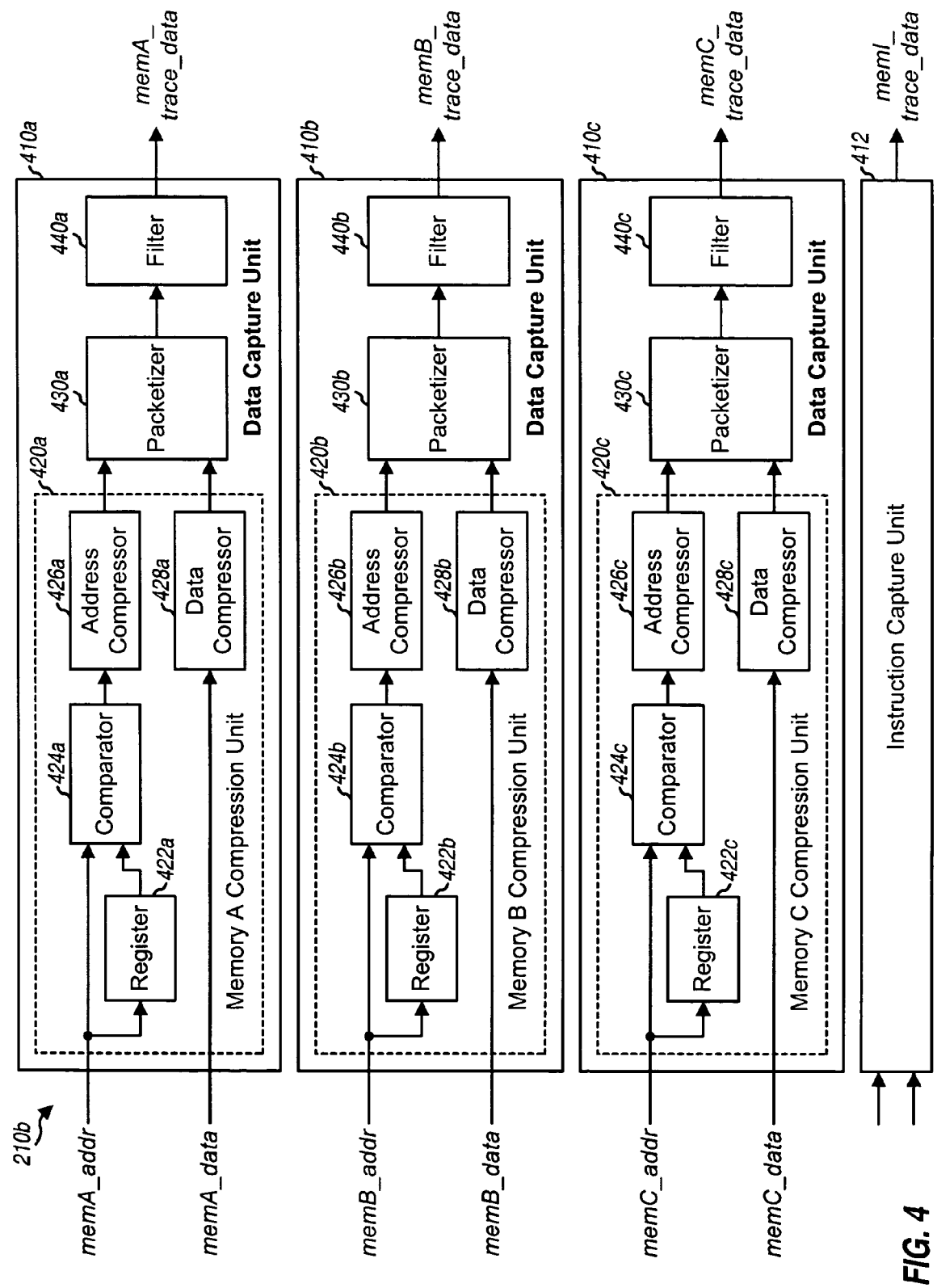
FIG. 4 shows a block diagram of a trace data capture unit for a DSP.

FIG. 4 shows a block diagram of an embodiment of trace data capture unit 210b for DSP 120. Unit 210b includes three data capture units 410a, 410b, and 410c for data memories 126a, 126b, and 126c, respectively, and an instruction capture unit 412 for instruction memory 124. Each data capture unit 410 includes a compression unit 420, a packetizer 430, and a filter 440.

Within data capture unit 410a for data memory 126a, a compression unit 420a receives an address and corresponding data (which are denoted as memA_addr and memA_data, respectively) for a current memory access of memory 126a. The current address, memA_addr, is stored in an address register 422a and also provided to an address comparator 424a. Comparator 424a also receives a stored address from register 422a for a prior memory access of data memory 126a, compares the current address against the stored address, and provides comparison result to an address compressor 426a. Address compressor 426a determines the number of lower order address bits in the current address that are different from the stored address and the minimum number (N) of address bits to be included in the trace data packet for the current memory access. Address compression may also be bypassed. Address compressor 426a provides to a packetizer 430a a compressed address containing N lower order bits in the current address or the uncompressed current address.

A data compressor 428a performs compression on the data for the current memory access. Data compression may be performed in various manners. For example, leading zeros in the data may be removed. As another example, the data for the current memory access may be compared against the data for the prior memory access, in similar manner as for address compression, and only the difference is sent. Some other examples include (1) removal of all zeros in the data and (2) constraining the data width to be 8 bits, 16 bits, or some other predetermined number of bits, depending on a priori knowledge of the data being traced, e.g., via user selection. Data compression may also be bypassed. Data compressor 428a provides compressed or uncompressed data to packetizer 430a.

Packetizer 430a receives the compressed or uncompressed address from address compressor 426a and the compressed or uncompressed data from data compressor 428a. Packetizer 430a forms a trace data packet for the current memory access of memory 126a, as described below. A filter 440a provides user-controlled filtering for data tracing so that the amount of trace data to be sent off-chip can be minimized. For example, tracing may only be performed (1) for memory accesses within a specified range of addresses, (2) if some specified conditions are met, and/or (3) based on some other criteria. Filter 440a provides filtered trace data for memory 126a (e.g., trace data packets that meet filtering criteria).

FIG. 4 shows a specific embodiment of data capture unit 410a for memory 126a. The other two data capture units 410b and 410c perform address and data compression, packetizing, and filtering for memory accesses of memories 126b and 126c, respectively. Instruction capture unit 412 may be implemented the same or different from data capture unit 410.

In general, the address and data compression, packetizing, and filtering may be performed in various manners and possibly in a different order than that shown in FIG. 4. For example, the filtering may be performed prior to the compression. As shown in FIG. 4, three different address registers 422a, 422b, and 422c are used to store the addresses for the latest memory accesses of data memories 126a, 126b, and 126c, respectively. This allows for independent address compression of the three data memories.

FIG. 4 shows a design in which a separate data capture unit 410 is used to capture trace data for each data memory. A single data capture unit may also capture trace data for all data memories, for example, in a time division multiplexed (TDM) manner. This single data capture unit can perform address compression independently for each of the data memories by (1) using a separate register to store the address for the prior memory access of each memory and (2) comparing the address for the current memory access of each memory against the stored address for that memory.

FIGS. 5A through 5D show four exemplary formats for a trace data packet. These exemplary formats are for a specific design in which (1) a full address contains 18 bits, (2) full or uncompressed data for a given memory address contains 32 bits, and (3) three data memories are available. One trace data packet in one of the four possible formats may be formed for each memory access of a given data memory.

Figures 5A, 5B, 5C, 5D:
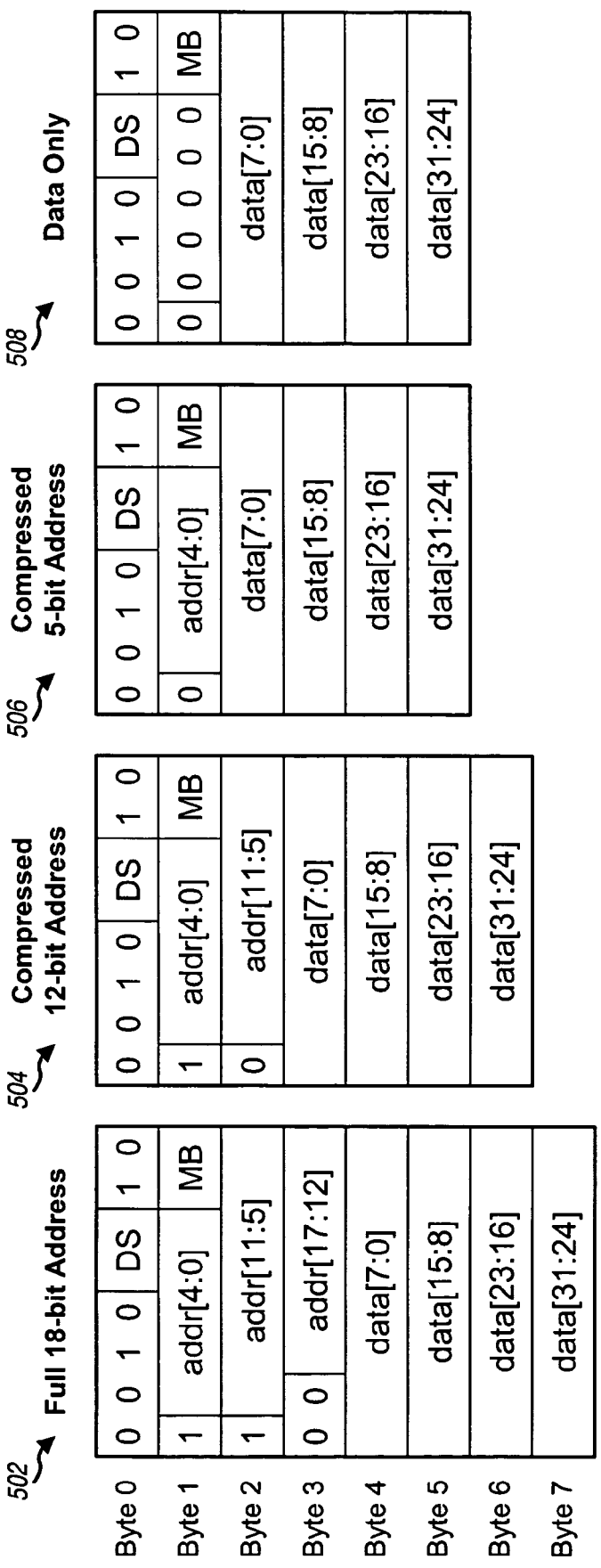
FIGS. 5A through 5D show four exemplary trace data packet formats.

FIG. 5A shows a packet format 502 for a full address. Format 502 contains 8 bytes. Byte 0 carries (1) a 4-bit field containing a binary value of '0010' to indicate a trace data packet, (1) a 2-bit DS field that indicates the size of the data field in the packet, and (3) a 2-bit field containing a binary value of '10' to indicate a trace data packet. For this embodiment, a trace data packet is indicated by a value of '0010' for the 4-bit field and a value of '10' for the rightmost 2-bit field. Other bit patterns and/or other means may also be used to indicate a trace data packet. In an embodiment, the DS field contains a binary value of '00', '01', '10', or '11' for a data field size of 0 byte, 1 byte, 2 bytes, or 4 bytes, respectively. The binary values of '00', '01', and '10' may be used for the DS field for compressed data, and the binary value of '11' may be used for uncompressed data. Byte 1 carries (1) a 1-bit field containing a binary value of '1' to indicate that another byte of address is included in the packet, (2) a 5-bit address field containing the five lowest order bits of the address (i.e., address bits 0 through 4), and (3) a 2-bit MB field that indicates the specific data memory to which the packet pertains. In an embodiment, the MB field contains a binary value of '00', '01', or '10' for data memory A, B, or C, respectively. The MB field thus carries a memory identifier for the specific data memory being accessed.

Byte 2 carries (1) a 1-bit field containing a binary value of '1' to indicate that another byte of address is included in the packet and (2) a 7-bit address field containing the seven middle order bits of the address (i.e., address bits 5 through 11). Byte 3 carries (1) a 2-bit field containing a binary value of '00' and (2) a 6-bit address field containing the six highest order bits of the address (i.e., address bits 12 through 17). In this example, DS=11, and bytes 5 through 8 carry a 4-byte data field for the data at the indicated address.

FIG. 5B shows a packet format 504 for a 12-bit partial address. Format 504 contains 7 bytes. Bytes 0 and 1 for format 504 are the same as bytes 0 and 1 for format 502 in FIG. 5A. Byte 2 carries (1) a 1-bit field containing a binary value of '0' to indicate that no more byte of address is included in the packet and (2) a 7-bit address field containing the seven middle order bits of the address. In this example, DS=11, and bytes 3 through 6 carry a 4-byte data field.

FIG. 5C shows a packet format 506 for a 5-bit partial address. Format 506 contains 6 bytes. Byte 0 for format 506 is the same as byte 0 for format 502 in FIG. 5A. Byte 1 carries (1) a 1-bit field containing a binary value of '0' to indicate that no more byte of address is included in the packet, (2) a 5-bit address field containing the five lowest order bits of the address, and (3) the 2-bit MB field. In this example, DS=11, and bytes 2 through 5 carry a 4-byte data field.

FIG. 5D shows a packet format 508 for no address. Format 508 also contains 6 bytes. Byte 0 for format 508 is the same as byte 0 for format 502 in FIG. 5A. Byte 1 carries (1) a 1-bit field containing a binary value of '0' to indicate that no more byte of address is included in the packet, (2) a 5-bit address field containing a binary value of '00000' to indicate that no address is included in the trace data packet, and (3) the 2-bit MB field. In this example, DS=11, and bytes 2 through 5 carry a 4-byte data field.

For packet formats 502, 504, 506 and 508, a binary value of '1' in the most significant (leftmost) bit of an address byte indicates that another address byte is included in the packet. Other mechanisms may also be used to indicate the size of the address in the trace data packet, and this is within the scope of the invention.

FIGS. 5A through 5D show four exemplary formats for the trace data packet. The general concept described in FIGS. 5A through 5D may be extended to cover other designs with addresses and data of other sizes, for any number of data memories, and so on. In general, any number of packet formats may be defined. Each packet format may include any number and any type of fields, and each field may include any number of bits. The fields may also be arranged differently from the arrangement shown in FIGS. 5A through 5D. The trace data packet includes a mechanism to indicate the specific memory or memory bank to which the packet pertains. If a designated field is used to indicate the data memory, as shown in FIGS. 5A through 5D, then the size of this field may be determined based on the number of data memories in the integrated circuit. The trace data packet also includes a mechanism (e.g., a designated bit in each address byte) to indicate the size of the address included in the packet.

Referring back to FIGS. 1 and 2, trace stream generator 250 generates a trace data stream containing the trace data packets from all trace data capture units 210. Each trace data packet contains a field with a memory identifier for the specific memory to which the packet pertains. A trace decompressor within analysis tool 190 can demultiplex the trace data packets in the trace data stream into multiple substreams, one substream for each memory, based on the memory identifiers included in these packets.

Figure 6:
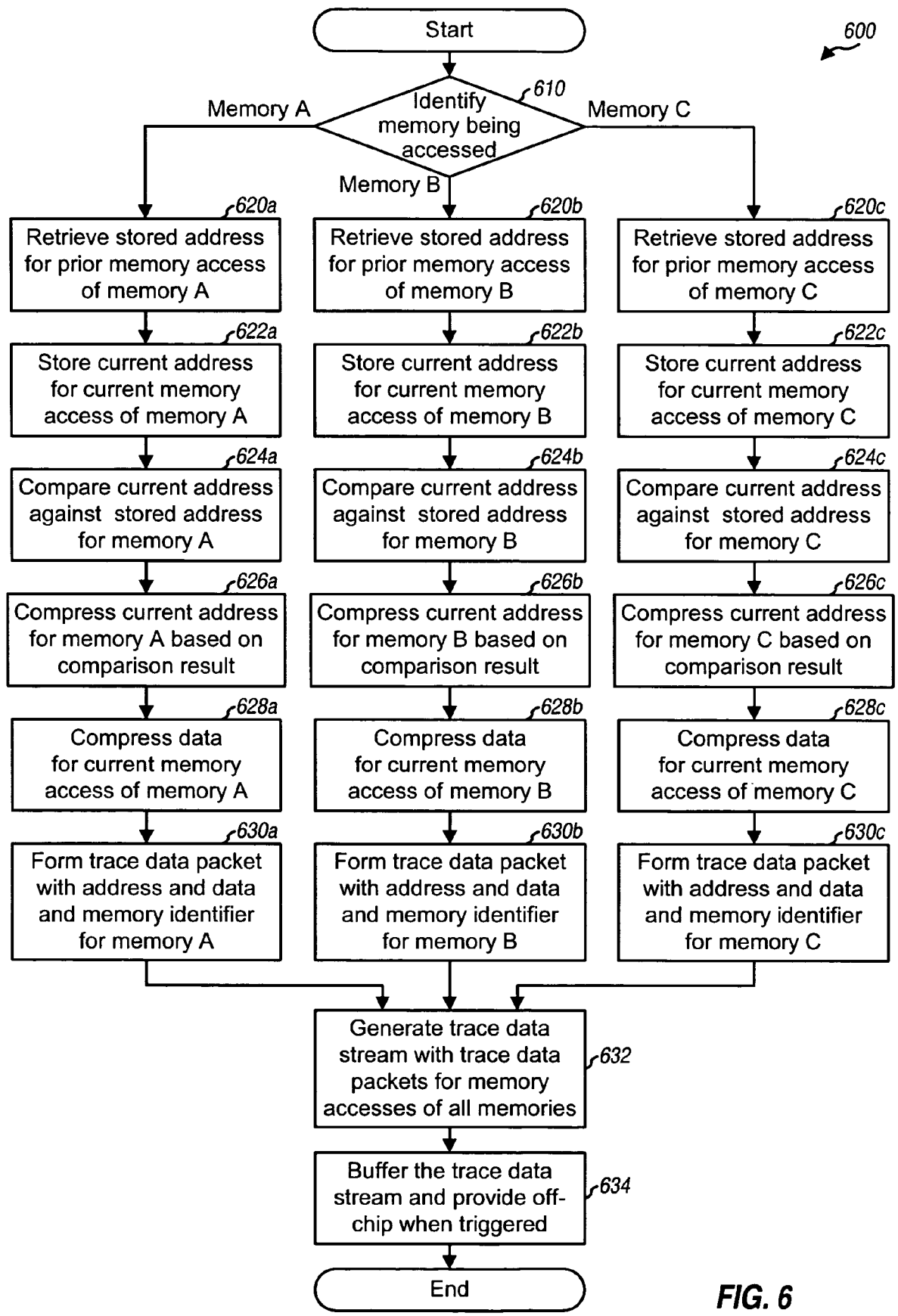
FIG. 6 shows a process for performing data tracing for an integrated circuit with multiple (e.g., three) independently accessible memories.

FIG. 6 shows a flow diagram of a process 600 for performing data tracing for an integrated circuit with multiple (e.g., three) independently accessible memories. Initially, the memory being accessed is identified and denoted as memory X, where X may be A, B, or C for the exemplary design shown in FIGS. 1 and 4 (block 610).

For data tracing of memory X, a stored address for a prior memory access of memory X is retrieved from address register X used for memory X (block 620). A current address for a current memory access of memory X is concurrently stored in address register X (block 622). The current address is compared against the stored address for memory X, for example, by performing an exclusive-OR (XOR) operation on the two addresses (block 624). Address compression may be performed on the current address, based on the result of the comparison, to obtain a compressed address for the memory access of memory X (block 626). Data compression may also be performed for the current memory access of memory X (block 628). A trace data packet is formed for the current memory access of memory X (block 630). This trace data packet includes (1) a memory identifier for memory X, (2) a full, compressed, or null address for the current memory access, and (3) compressed, uncompressed, or null data for the current memory access.

The processing in blocks 620 through 630 may be performed separately for each memory, for example, by the data capture unit assigned to that memory. A trace data stream is generated with the trace data packets for the memory accesses of all memories (block 632). The trace data stream is buffered and provided off-chip when triggered (block 634).

The data tracing techniques described herein allow for efficient compression of trace data for an integrated circuit with multiple memories. Such an integrated circuit may have one or more embedded DSPs, as shown in FIG. 1. A DSP typically utilizes multiple data memories for greater data access capability, uses variable length instructions, and often executes tight loops (e.g., for digital filters). The data tracing techniques described herein may be advantageously used to debug an integrated circuit with one or more embedded DSPs.

In general, the data tracing techniques described herein may be used for any integrated circuit with multiple memories. Such an integrated circuit may include one or more embedded microprocessors, one or more DSPs, and/or other controllers (e.g., as shown in FIG. 1). Integrated circuits with multiple memories are commonly used for wireless communication devices (e.g., cellular phones), personal digital assistants (PDAs), and other electronic devices. The data tracing techniques described herein may also be used for various end applications such as wireless communication, computing, networking, and so on.

The data tracing techniques described herein may be implemented in hardware, firmware, or a combination thereof. For a hardware implementation, the units used to support data tracing (e.g., trace module 140, trace port 142, and JTAG port 138) may be implemented with hardware embedded within an integrated circuit, an application specific integrated circuit (ASIC), a digital signal processing device (DSPD), a programmable logic device (PLD), a field programmable gate array (FPGA), and so on. The data tracing may also be performed based on or in conjunction with firmware codes that perform the functions described herein. The firmware codes may be stored in a memory (e.g., memory 124 in FIG. 1) and executed by a processor or processing unit (e.g., trace module 140).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a trace module operable to:
   receive first trace data and a corresponding first current memory address from a first memory;
   form a first trace data packet that includes a compressed first current address based on the first current memory address, a first memory identifier associated with the first memory, and one of the first trace data and compressed first trace data;
   receive second trace data and a corresponding second current memory address from a second memory concurrently with receiving the first trace data and the corresponding first current memory address from the first memory;
   form a second trace data packet that includes a compressed second current address based on the second current memory address, a second memory identifier associated with the second memory, and one of the second trace data and compressed second trace data;
   filter the first trace data packet based on a first address criterion;
   filter the second trace data packet based on a second address criterion;
   generate a first trace data stream that does not include the first trace data packet or the second trace data packet prior to storing the trace data stream in a buffer of the trace module when the first trace data packet does not satisfy the first address criterion and when the second trace data packet does not satisfy the second address criterion; and
   generate a second trace data stream, wherein the second trace data stream includes the first trace data packet when the first trace data packet satisfies the first address criterion.

2. The integrated circuit of claim 1, wherein the trace module includes the buffer, wherein the buffer is operative to provide the first trace data stream or the second data stream when triggered.

3. The integrated circuit of claim 1, further comprising a port operative to receive configuration information, wherein the configuration information identifies instructions to be traced.

4. The integrated circuit of claim 1, wherein the trace module includes:
   a first data capture unit including a first register operative to store a first stored address associated with a prior memory access of the first memory; and
   a second data capture unit including a second register operative to store a second stored address associated with a prior memory access of the second memory.

5. The integrated circuit of claim 4, wherein:
   the first data capture unit includes a first data compressor operative to compress the first trace data; and
   the second data capture unit includes a second data compressor operative to compress the second trace data.

6. The integrated circuit of claim 5, wherein the first data compressor is operative to remove one of leading zeros and leading sign bits of the first trace data.

7. The integrated circuit of claim 4, wherein:
   the first data capture unit includes a first packetizer operative to form the first trace data packet; and
   the second data capture unit includes a second packetizer operative to form the second trace data packet.

8. The integrated circuit of claim 1, wherein each trace data packet comprises a memory identifier field operative to store a corresponding memory identifier, an address field, a size field indicative of a size of the address field, and a data field.

9. The integrated circuit of claim 1, wherein the trace module is operative to independently and concurrently compress addresses of the first memory and the second memory.

10. The integrated circuit of claim 1, further comprising a digital signal processor (DSP) operatively coupled to the first memory and the second memory.

11. The integrated circuit of claim 1, wherein the first memory and the second memory are accessible concurrently via one instruction.

12. The integrated circuit of claim 1, wherein the trace module is operative to determine a number of lower order address bits to be included in the compressed first current address.

13. The method of claim 1, wherein the compressed first current address includes 12 bits.

14. The method of claim 1, wherein the compressed first current address includes 5 bits.

15. The integrated circuit of claim 1, further comprising the buffer to store a generated trace data stream.

16. The integrated circuit of claim 1, wherein the second trace data stream further includes the second trace data packet when the second trace data packet satisfies the second address criterion.

17. An integrated circuit comprising:
  a plurality of trace data capture units including a first trace data capture unit and a second trace data capture unit, wherein each trace data capture unit comprises:
    a corresponding register associated with a corresponding selected memory of a plurality of memories, the corresponding register operative to store an address associated with a prior memory access of the corresponding selected memory;
    a corresponding comparator operative to compare a current memory address associated with a current memory access of the corresponding selected memory with the address stored in the corresponding register;
    a corresponding address compressor operative to generate a compressed current address associated with the current memory access of the corresponding selected memory, wherein the compressed current address is based on a comparison result from the comparator;
    a corresponding packetizer operative to form a trace data packet associated with the current memory access of the corresponding selected memory, the trace data packet including the compressed address and one of data associated with the current memory access of the corresponding selected memory and compressed data associated with the current memory access of the corresponding selected memory; and
    a corresponding filter operative to filter a trace data packet formed by the corresponding packetizer based on a corresponding address criterion; and
  a trace stream generator operable to form a first trace data stream that does not include a first trace data packet associated with the first data capture unit or a second trace data packet associated with the second data capture unit when the first trace data packet does not satisfy a first address criterion and the second trace data packet does not satisfy a second address criterion, wherein the trace stream generator is further operable to form a second trace data stream that includes the first trace data packet when the first trace data packet satisfies the first address criterion or that includes the second trace data packet when the second trace data packet satisfies the second address criterion.

18. The integrated circuit of claim 17, further comprising a digital signal processor (DSP) operatively coupled to the plurality of memories, wherein the plurality of memories are operable to store data associated with the DSP.

19. The method of claim 17, wherein a most significant bit of the compressed current memory address differs from a most significant bit of a corresponding portion of the stored address associated with the prior memory access of the selected memory.

20. The integrated circuit of claim 17, wherein the buffer unit buffers a generated trace data stream upon receipt by the integrated circuit of a trigger packet.

21. The integrated circuit of claim 17, wherein the buffer unit buffers a generated trace data stream until a trigger packet is received by the integrated circuit.

22. The integrated circuit of claim 17, wherein the buffer unit stores a predetermined number of trace data entries after the integrated circuit receives a trigger packet.

23. An integrated circuit comprising:
  means for concurrently storing a plurality of memory addresses, wherein each stored memory address is associated with a corresponding prior memory access of one of a plurality of memories;
  means for comparing a current memory address associated with a current memory access of a selected memory against the corresponding stored memory address of the selected memory;
  means for generating a compressed memory address associated with the current memory access of the selected memory based on a comparison result; and
  means for forming a trace data packet associated with the current memory access of the selected memory, wherein the trace data packet includes the compressed memory address and data associated with the current memory access of the selected memory; and
  means for filtering the trace data packet based on an address criterion;
  means for forming a first trace data stream that does not include a first trace data packet or a second trace data packet when the first trace data packet does not satisfy a first address criterion and the second trace data packet does not satisfy a second address criterion; and
  means for forming a second trace data stream that includes the first trace data packet when the first trace data packet satisfies the first address criterion or that includes the second trace data packet when the second trace data packet satisfies the second address criterion.

24. The integrated circuit of claim 10, further comprising a direct memory access (DMA) controller operatively coupled to the first memory and the second memory.

25. A method of tracing data in an integrated circuit including multiple memory devices, the method comprising:
  capturing first data including a first memory address from a first memory device;
  forming a first trace data packet based upon the first data and the first memory address;
  capturing second data including a second memory address from a second memory device;
  forming a second trace data packet based upon the second data and the second memory address;
  filtering the first trace data packet based on a first address criterion;
  filtering the second trace data packet based on a second address criterion;
  forming a first trace data stream that does not include the first trace data packet or the second trace data packet when the first trace data packet does not satisfy the first address criterion and when the second trace data packet does not satisfy the second address criterion;
  forming a second trace data stream including the first trace data packet when the first trace data packet satisfies the first address criterion or including the second trace data packet when the second trace data packet satisfies the second address criterion; and buffering a generated trace data stream prior to providing the generated trace data stream off-chip.

26. The method of claim 25, wherein the first data and the second data are captured concurrently.

27. The method of claim 25, further comprising compressing the first data to generate compressed data, and including the compressed data in the first trace data packet.

28. The method of claim 25, further comprising capturing third data from a third memory device.

* * * * *

UNITED STATES PATENT AND TRADEMARK OFFICE
CERTIFICATE OF CORRECTION

| | | |
|---|---|---|
| PATENT NO. | : 7,702,964 B2 | Page 1 of 1 |
| APPLICATION NO. | : 10/843971 | |
| DATED | : April 20, 2010 | |
| INVENTOR(S) | : Johnny K. John | |

It is certified that error appears in the above-identified patent and that said Letters Patent is hereby corrected as shown below:

Column 10, Line 26, Claim 2 "the second data" should read "the second trace data" used throughout claims Signed and Sealed this Twenty-fifth Day of October, 2011

David J. Kappos
*Director of the United States Patent and Trademark Office*